(12) United States Patent
Takemasa et al.

(10) Patent No.: US 12,107,189 B2
(45) Date of Patent: Oct. 1, 2024

(54) LIGHT-EMITTING ELEMENT AND ELECTRONIC DEVICE

(71) Applicant: Japan Display Inc., Tokyo (JP)

(72) Inventors: Kenichi Takemasa, Tokyo (JP); Kazuyuki Yamada, Tokyo (JP); Keisuke Asada, Tokyo (JP); Daiki Isono, Tokyo (JP)

(73) Assignee: Japan Display Inc., Tokyo (JP)

( * ) Notice: Subject to any disclaimer, the term of this patent is extended or adjusted under 35 U.S.C. 154(b) by 330 days.

(21) Appl. No.: 17/455,708

(22) Filed: Nov. 19, 2021

(65) Prior Publication Data

US 2022/0165916 A1 May 26, 2022

(30) Foreign Application Priority Data

Nov. 24, 2020 (JP) .................................. 2020-194462

(51) Int. Cl.
  *H01L 27/15* (2006.01)
  *H01L 31/12* (2006.01)
  *H01L 33/38* (2010.01)
  *H01L 33/62* (2010.01)

(52) U.S. Cl.
  CPC .......... *H01L 33/382* (2013.01); *H01L 27/156* (2013.01); *H01L 33/62* (2013.01)

(58) Field of Classification Search
  CPC ..... H01L 33/382; H01L 27/156; H01L 33/62; H01L 33/44; H01L 33/38; H01L 2933/0016; H01L 2933/0066

USPC ......................................................... 257/79
See application file for complete search history.

(56) References Cited

U.S. PATENT DOCUMENTS

| | | | |
|---|---|---|---|
| 2015/0108533 A1* | 4/2015 | Fukumitsu | H01L 33/483 257/99 |
| 2018/0182940 A1* | 6/2018 | Yamamoto | H01L 33/58 |
| 2018/0233496 A1 | 8/2018 | Yoo et al. | |
| 2020/0161499 A1 | 5/2020 | Ota et al. | |

FOREIGN PATENT DOCUMENTS

| | | |
|---|---|---|
| CN | 111063779 A | 4/2020 |
| JP | 2018129496 A | 8/2018 |

OTHER PUBLICATIONS

Office Action issued on Jun. 4, 2024, in corresponding Japanese Application No. 2020-194462, 10 pages.

* cited by examiner

*Primary Examiner* — Theresa T Doan
(74) *Attorney, Agent, or Firm* — Maier & Maier, PLLC

(57) ABSTRACT

According to one embodiment, a lighting-emitting element includes a light-emitting portion, a first terminal electrode and a second terminal electrode. The first terminal electrode includes a first cavity portion at a position overlapping a first connection electrode in planar view when the first terminal electrode is brought into contact with the first connection electrode. The second terminal electrode includes a second cavity portion at a position overlapping a second connection electrode in planar view when the second terminal electrode is brought into contact with the second connection electrode.

18 Claims, 12 Drawing Sheets

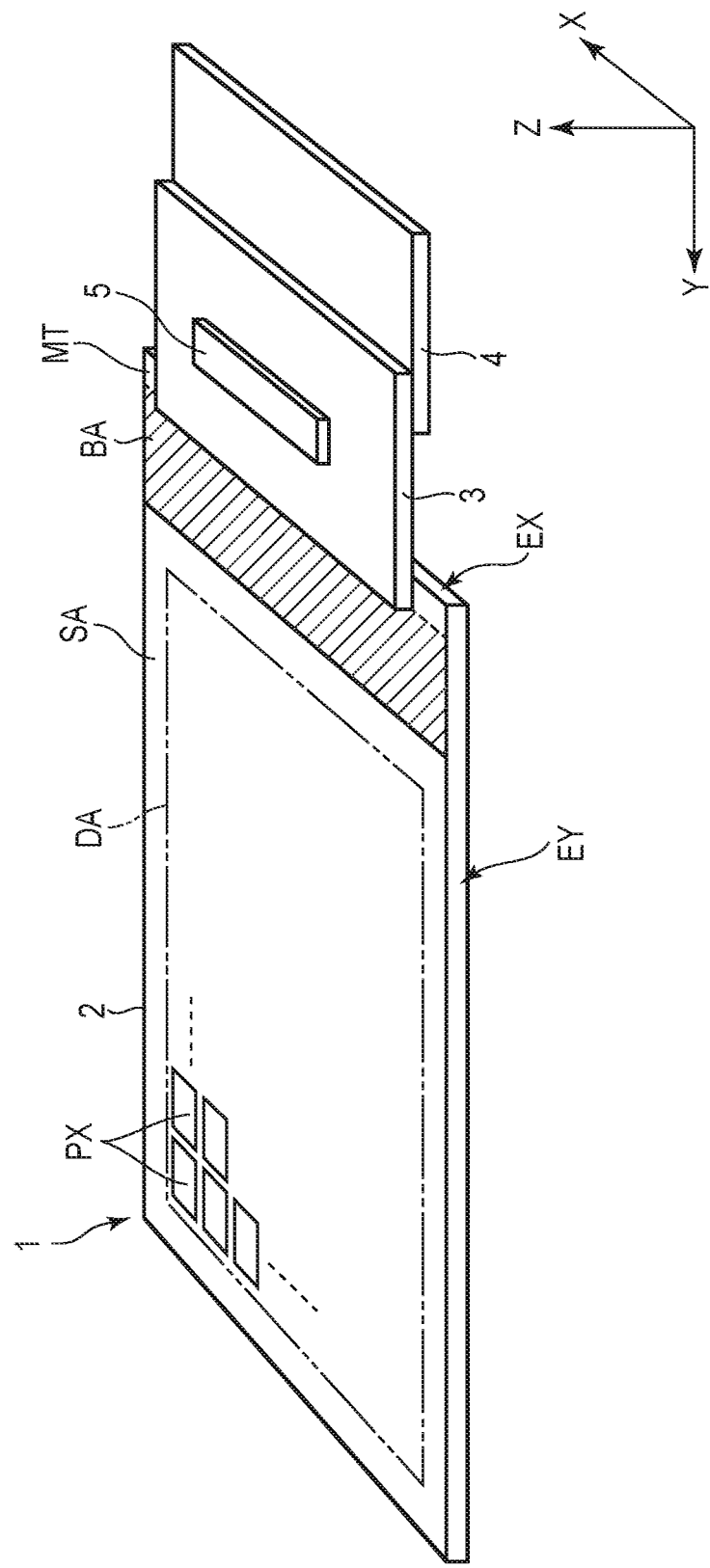
F I G. 1

LIGHT-EMITTING ELEMENT AND ELECTRONIC DEVICE

CROSS-REFERENCE TO RELATED APPLICATIONS

This application is based upon and claims the benefit of priority from Japanese Patent Application No. 2020-194462, filed Nov. 24, 2020, the entire contents of which are incorporated herein by reference.

FIELD

Embodiments described herein relate generally to a light-emitting element and an electronic device.

BACKGROUND

Electronic devices (for example, display devices, sensor devices, etc.) employing light-emitting diodes (LEDs), which are self-luminous elements, are known. In recent years, electronic devices using minute light emitting diode elements (hereinafter referred to simply as "light-emitting elements") such as micro-LEDs and mini-LEDs have been developed for the purpose of improving performance.

In the manufacture of electronic devices using such light-emitting elements, a method of mounting the light-emitting elements on an array substrate of the electronic device is adopted. In this method, a terminal electrode of a light-emitting element is placed on to be in contact with the connection electrode formed on the array substrate, and a laser beam is irradiated in the vicinity of the contact surface from a light-emitting element side, thus metal-bonding the terminal electrode of the light-emitting element to the connection electrode on the array substrate by the thermal energy of the laser beam.

However, in such a mounting method, it is necessary to irradiate the laser beam in the vicinity of the contact surface between the connection electrode on the array substrate and the terminal electrode of the light emitting element, and if the laser beam cannot be sufficiently irradiated to the vicinity of the contact surface, the metal bonding between the terminal electrode of the light emitting element and the connection electrode on the array substrate may be insufficient. In other words, the light-emitting element may not be efficiently mounted on the array substrate of the electronic device.

BRIEF DESCRIPTION OF THE DRAWINGS

FIG. 1 is a perspective view schematically showing a configuration of an electronic device in which a light-emitting element of an embodiment.

DETAILED DESCRIPTION

Figure 2:
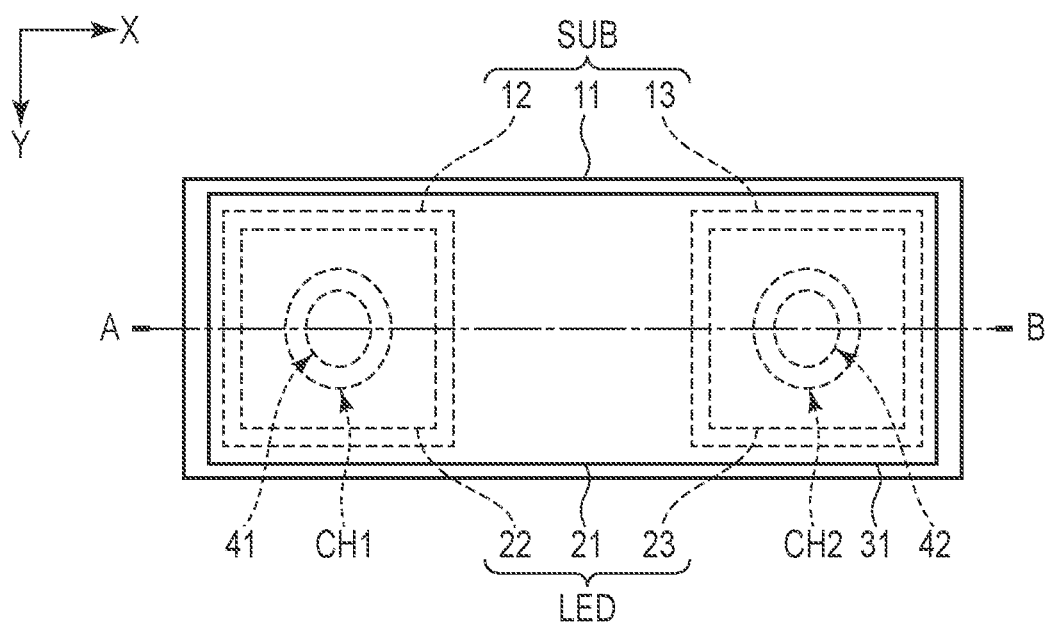
FIG. 2 is a plan view showing an example of the configuration of a light-emitting element of the embodiment.

In general, according to one embodiment, a lighting-emitting element is mounted on a substrate on which a pair of a first connection electrode and a second connection electrode are formed. The light-emitting element includes a light-emitting portion, a first terminal electrode and a second terminal electrode. The light-emitting portion includes a first main surface that emits light and a second main surface on an opposite side to the first main surface. The first terminal electrode and the second terminal electrode are provided on a second main surface side of the light-emitting portion. The first terminal electrode includes a first cavity portion at a position overlapping the first connection electrode in planar view when the first terminal electrode is brought into contact with the first connection electrode, and is joined with the first connection electrode by a laser beam irradiated from the light-emitting portion side. The second terminal electrode includes a second cavity portion at a position overlapping the second connection electrode in planar view when the second terminal electrode is brought into contact with the second connection electrode, and is joined with the second connection electrode by the laser beam.

According to another embodiment, an electronic device includes a substrate on which a pair of a first connection electrode and a second connection electrode are formed and a light-emitting element mounted on the substrate and electrically connected to the first connection electrode and the second connection electrode. The light-emitting element includes a light-emitting portion including a first main surface that emits light and a second main surface on an opposite side to the first main surface, and a first terminal electrode and a second terminal electrode provided on a second main surface side of the light-emitting portion. The first terminal electrode includes a first cavity portion at a position where overlapping the first connection electrode in planar view when the first terminal electrode is brought into contact with the first connection electrode, and is joined to the first connection electrode by a laser beam irradiated from the light-emitting portion side. The second terminal electrode includes a second cavity portion at a position overlapping the second connection electrode in planar view when the second terminal electrode is brought into contact with the second connection electrode, and is joined to the second connection electrode by the laser beam.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the structures are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and redundant explanations may be omitted.

In this specification, the light-emitting element LED will be mainly described. Further, this specification illustrates a display device 1 as an example of the electronic devices in which a light-emitting element LED is mounted, but the embodiments are not limited to this, the light-emitting element LED may be mounted in an electronic device different from the display device 1.

FIG. 1 is a perspective view schematically showing a configuration of the display device 1 in which the light-emitting element LED of this embodiment is mounted. FIG. 1 shows a three-dimensional space defined by a first direction X, a second direction Y orthogonal to the first direction X and a third direction Z orthogonal to the first direction X and the second direction Y. Note that the first direction X and the second direction Y are orthogonal to each other, but may intersect at an angle other than ninety degrees. In the following descriptions, viewing the display device 1 from a direction parallel to the third direction Z will be referred to as planar view.

As shown in FIG. 1, the display device 1 comprises a display panel 2, a first circuit board 3, a second circuit board 4, and the like.

The display panel 2 is, for example, a rectangular in shape. In the illustrated example, a short edge EX of the display panel 2 is parallel to the first direction X, and a long edge EY of the display panel 2 is parallel to the second direction Y. The third direction Z corresponds to the thickness direction of the display panel 2. A main surface of the display panel 2 is parallel to the X-Y plane defined by the first direction X and the second direction Y. The display panel 2 includes a display area DA and a peripheral area SA on an outer side the display area DA. The peripheral area SA includes a terminal area MT. In the example illustrated, the peripheral area SA surrounds the display area DA.

The display area DA is a region which displays images and comprises a plurality of pixels PX arranged in a matrix, for example. Each pixel PX includes a light-emitting element LED, a switching element (drive transistor) which drives the light-emitting element LED, and the like. The driving transistor is formed, for example, from a thin-film transistor (TFT).

The terminal area MT is provided along the short edge EX of the display panel 2 and includes a terminal which electrically connects the display panel 2 to an external device or the like.

The first circuit board 3 is mounted on the terminal area MT and is electrically connected to the display panel 2. The first circuit board 3 is, for example, a flexible printed circuit board. The first circuit board 3 comprises an IC chip 5 which drives the display panel 2, and the like. In the example illustrated, the IC chip 5 is placed on the first circuit board 3, but it may be placed under the first circuit board 3. Alternatively, the IC chip 5 may be mounted on a board other than the first circuit board 3. In this case, the IC chip 5 may be mounted on the peripheral area SA of the display panel 2, or on the second circuit board 4. The second circuit board 4 is, for example, a rigid printed circuit board. The second circuit board 4 is connected to the first circuit board 3, for example, below the first circuit board 3.

The IC chip 5 is connected to a control board (not shown) via, for example, the second circuit board 4. The IC chip 5 drives a plurality of pixels PX based on video signals output from the control board, for example, thus executing the control of displaying images on the display panel 2.

The display panel 2 may include a bend area BA, which is indicated with the shaded lines. The bend area BA is an area to be bent when the display device 1 is housed in a housing such as of an electronic device. The bend area BA is located on a terminal area MT side of the peripheral area SA. In the state where the bend area BA is bent, the first circuit board 3 and the second circuit board 4 are arranged to face the display panel 2.

In the following descriptions, the light-emitting element LED to be mounted on the display device 1 (display panel 2) described above will be explained in detail.

FIG. 2 is a plan view showing an example of the configuration of the light-emitting element LED of this embodiment.

As shown in FIG. 2, the light-emitting element LED is mounted on an array substrate SUB of the display device 1 (display panel 2). In more detail, the light-emitting element LED is mounted on the insulating substrate 11 so as to be electrically connected to a first connection electrode 12 and a second connection electrode 13 formed on the insulating substrate 11 that constitutes the array substrate SUB of the display device 1 (display panel 2). The first connection electrode 12 and the second connection electrode 13 may be referred to as bump electrodes or simply, bumps.

The light-emitting element LED comprises a light-emitting portion 21, a first terminal electrode 22 and a second terminal electrode 23. Although will be described in detail later, the light-emitting element LED overlap the insulating layer 31 in planar view. The first terminal electrode 22 is connected to the light-emitting portion 21 via a first opening CH1 formed in the insulating layer 31. The second terminal electrode 23 is connected to the light-emitting portion 21 via a second opening CH2 formed in the insulating layer 31. The first terminal electrode 22 is an electrode that functions as an anode or cathode electrode of the light-emitting element LED. The second terminal electrode 23 is an electrode that functions as a cathode or anode electrode of the light-emitting element LED.

Note that a first cavity portion 41 and a second cavity portion 42 shown in FIG. 2 will be described later, a detailed explanation thereof is omitted here.

Figure 3:
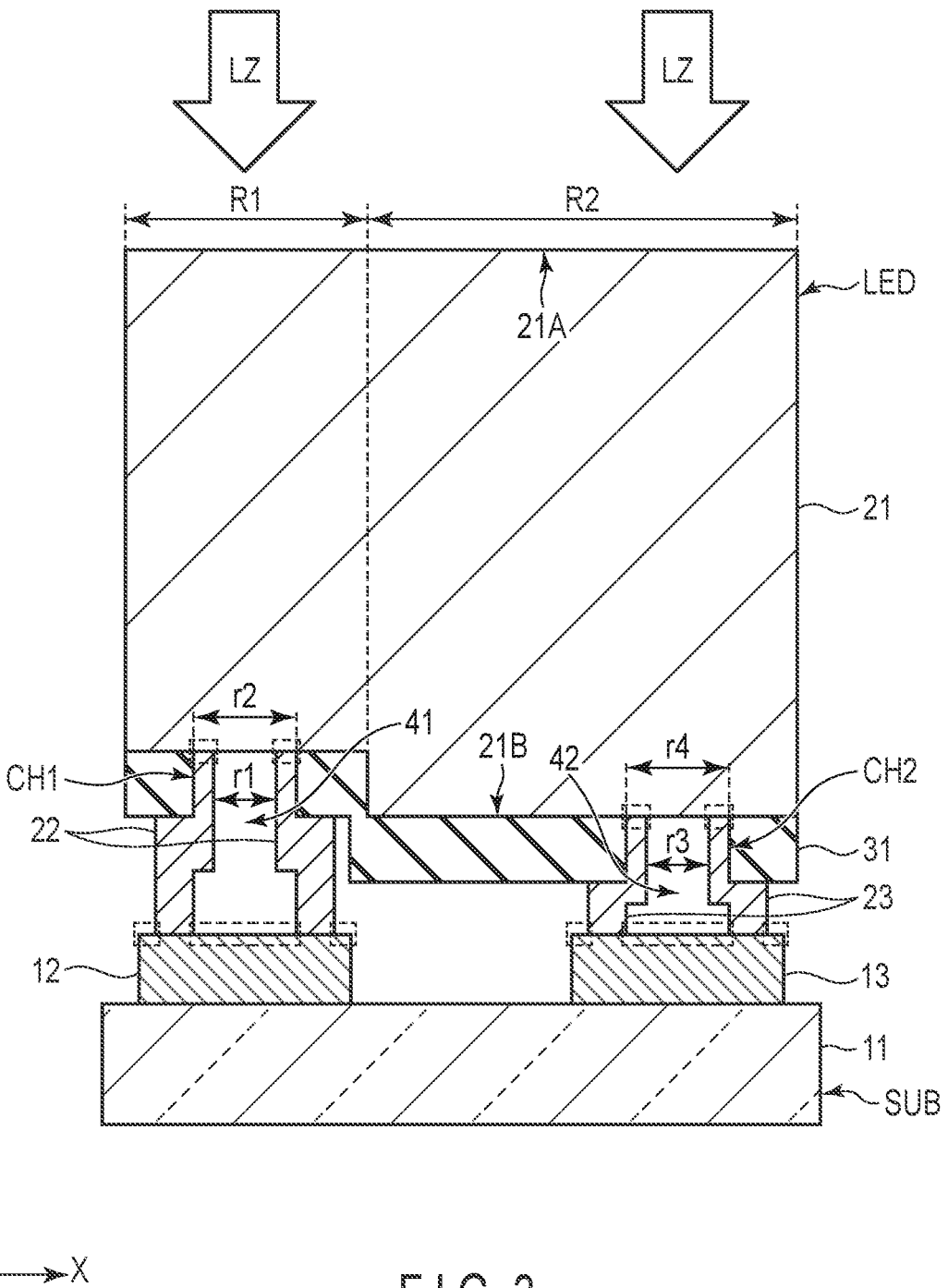
FIG. 3 is a cross-sectional view of the light-emitting element taken along line A-B shown in FIG. 2.

FIG. 3 is a cross-sectional view showing of the element taken along line A-B shown in FIG. 2.

As shown in FIG. 3, the light-emitting element LED is mounted on the array substrate SUB. The substrate SUB comprises the insulating substrate 11, the first connection electrode 12 and the second connection electrode 13, as described above.

Although not shown in FIG. 3, on the insulating substrate 11, drive transistors (TFTs) for driving the light-emitting element LED and various wiring patterns are formed. The material of the insulating substrate 11 is not particularly limited as long as it can withstand the processing temperature when manufacturing the TFTs, but for example, a glass substrate such as quartz or alkali-free glass, or a resin substrate such as polyimide can be used. When the insulating substrate 11 is a resin substrate having flexibility, the display device 1 can be configured as a sheet display. Note that when a resin substrate such as of polyimide is used for the insulating substrate 11, it may be more appropriate that the insulating substrate 11 should be referred to as an organic insulating layer or resin layer.

On the insulating substrate 11, the first connection electrode 12 and the second connection electrode 13 are formed in a pair. By the irradiation of a laser beam LZ for bonding, the first connection electrodes 12 is eutectically joined with the first terminal electrode 22 which constitutes the light-emitting element LED and is electrically connected to the first terminal electrode 22, as will be described in detail later. Similarly, the second connection electrode 13 is eutectically joined with the second terminal electrode 23 that constitutes the light-emitting element LED by the irradiation of the laser beam LZ for bonding, and is electrically connected to the second terminal electrode 23.

The first connection electrode 12 and the second connection electrode 13 are made, for example, of a metal material having electrical conductivity. In this embodiment, for example, tin (Sn) is used as the metal material. However, the material is not limited to that of this example, but any metal material may be used for the first connection electrode 12 and the second connection electrode 13, as long as it is a metal material that can be eutectically joined with the first terminal electrode 22 and the second terminal electrode 23 that constitute the light-emitting element LED.

As shown in FIG. 3, the light-emitting element LED comprises has the light-emitting portion 21, the first terminal electrode 22 and the second terminal electrode 23.

The light-emitting portion 21 comprises a first main surface 21A and a second main surface 21B on an opposite side to the first main surface 21A. From the first main surface 21A of the light-emitting portion 21, for example, R, G and B light is emitted. Note that light may be emitted not only from the first main surface 21A but also from a side surface and the second main surface 21B of the light-emitting portion 21, and the like.

The light-emitting portion 21 has different thicknesses (length along the third direction Z (height)) in a region R1 where the first terminal electrode 22 is provided and in a region R2 where the second terminal electrode 23 is provided. For this reason, the second main surface 21B of the light-emitting portion 21 has a step having a predetermined height at a boundary between the region R1 and the region R2, as shown in FIG. 3.

The second main surface 21B of the light-emitting portion 21 is covered by the insulating layer 31. The light-emitting portion 21 is connected to the first terminal electrode 22 via the first opening CH1 formed in the insulating layer 31. Further, the light-emitting portion 21 is connected to the second terminal electrode 23 via the second opening CH2 formed in the insulating layer 31. The length of the first terminal electrode 22 along the third direction Z and the length of the second terminal electrode 23 along the third direction Z are different from each other due to the presence of the step in the second main surface 21B described above. With this configuration, it is possible to determine which of the first terminal electrode 22 and the second terminal electrode 23 is the electrode that functions as the anode electrode and which is the electrode that functions as the cathode electrode.

The insulating layer 31 is made of, for example, an insulating material that transmits the laser beam LZ for bonding, such as silicon oxide (SiO2). When the first cavity portion 41 and the second cavity portion 42 are provided at respective positions overlapping the first opening CH1 and the second opening CH2 in planar view, the laser beam LZ for bonding can pass through the first cavity portion 41 and the second cavity portion 42, and therefore the insulating layer 31 need not be made of an insulating material that transmits the laser beam LZ for bonding, as will described in detail later.

The first terminal electrode 22 and the second terminal electrode 23, for example, are made of a metal material having electrical conductivity. In this embodiment, gold (Au) is used as the metal material. However, the material is not limited to that of this example, but any metal material may be used for the first terminal electrode 22 and the second terminal electrode 23 as long as it is a metal material that can be eutectically joined with the first connection electrode 12 and the second connection electrode 13.

As shown in FIG. 3, the first terminal electrode 22 is formed to be connected with a part of the second main surface 21B of the light-emitting portion 21 exposed by the first opening CH1 made in the insulating layer 31. With this configuration, the first cavity portion 41 can be provided at a position overlapping the first connection electrode 12 in planar view when the first terminal electrode 22 is placed to abut against the first connection electrode 12. In other words, the first cavity portion 41 can be provided between the second main surface 21B of the light-emitting portion 21 and the first connection electrode 12 in the third direction Z, surrounded by the first terminal electrode 22. As shown in FIG. 3, a diameter r1 of the first cavity portion 41 should preferably be less than a diameter r2 of the first opening CH1, which is, for example, about 2 μm to 3 μm or less in size. But, the diameter r1 of the first cavity portion 41 is not limited to the numerical values provided described above, but is determined according to the diameter r2 of the first opening CH1 and the sizes of the first terminal electrode 22 and the first connection electrode 12.

Similarly, the second terminal electrode 23 is formed to be connected with a part of the second main surface 21B of the light-emitting portion 21 exposed by the second opening CH2 formed in the insulating layer 31. With this configuration, the second cavity portion 42 can be provided at a position overlapping the second connection electrode 13 in planar view when the second terminal electrode 23 is placed to abut against the second connection electrode 13. In other words, the second cavity portion 42 can be provided between the second main surface 21B of the light-emitting portion 21 and the second connection electrode 13 along the third direction Z, surrounded by the second terminal electrode 23. As shown in FIG. 3, a diameter r3 of the second cavity portion 42 should preferably be less than a diameter r4 of the second opening CH2, which is, for example, about 2 μm to 3 μm or less in size. But, the diameter r3 of the second cavity portion 42 is not limited to these numerical values, but is determined according to the diameter r4 of the second opening CH2 and the sizes of the second terminal electrode 23 and the second connection electrode 13.

Note that as shown in FIG. 3, the length (height) of the first cavity portion 41 along the third direction Z is greater than the length (height) of the second cavity portion 42 along the third direction Z due to the presence of the step in the second main surface 21B of the light-emitting portion 21.

Here, as shown in FIG. 3, the first connection electrode 12 is placed to abut to the first terminal electrode 22 and the second connection electrode 13 is placed to abut to the second terminal electrode 23 by aligning their positions, and then the laser beam LZ for bonding is irradiated from the light-emitting portion 21 side.

The laser beam for bonding LZ irradiated from the light-emitting portion 21 side passes through the light-emitting portion 21 and the first cavity portion 41, and is applied to the vicinity of the contact surface between the first connection electrode 12 and the first terminal electrode 22. The area enclosed by the dashed line shown in FIG. 3 corresponds to the area where the laser beam LZ for bonding is irradiated. With this configuration, the laser beam LZ for bonding can be irradiated to the vicinity of the contact surface between the first connection electrode 12 and the first terminal electrode 22, and the heat energy generated by the laser beam LZ for bonding can be efficiently applied to the contact surface of the first connection electrode 12 and the first terminal electrode 22. Therefore, as shown in FIG. 4, between the first connection electrode 12 and the first terminal electrode 22, a first alloy layer 51 made of a eutectic alloy is formed, and the first connection electrode 12 and the first terminal electrode 22 are metal-joined by the first alloy layer 51.

Similarly, the laser beam LZ for bonding irradiated from the light-emitting portion 21 side passes through the light-emitting portion 21 and the second cavity portion 42 and is applied to the vicinity of the contact surface between the second connection electrode 13 and the second terminal electrode 23. With this configuration, the laser beam LZ for joining can be irradiated to the vicinity of the contact surface of the second connection electrode 13 and the second terminal electrode 23, and the heat energy generated by the laser beam LZ for joining can be efficiently applied to the contact surface of the second connection electrode 13 and the second terminal electrode 23. Therefore, as shown in FIG. 4, between the second connection electrode 13 and the second terminal electrode 23, a second alloy layer 52 made of a eutectic alloy is formed, and the second connection electrode 13 and the second terminal electrode 23 are metal-joined by the second alloy layer 52.

As described above, in this embodiment, the first connection electrode 12 and the second connection electrode 13 are formed of tin (Sn). On the other hand, the first terminal electrode 22 and the second terminal electrode 23 are made of gold (Au). In other words, in this embodiment, layers made of Sn—Au eutectic alloys are formed as the first alloy layer 51 and the second alloy layer 52. As already explained, for the first connection electrode 12 and the first terminal electrode 22, and the second connection electrode 13 and the second terminal electrode 23, other metal materials can be used as long as they can form eutectic alloys with each other. For example, the first connection electrode 12, the first terminal electrode 22, the second connection electrode 13 and the second terminal electrode 23 may all be composed of tin (Sn).

Figure 4:
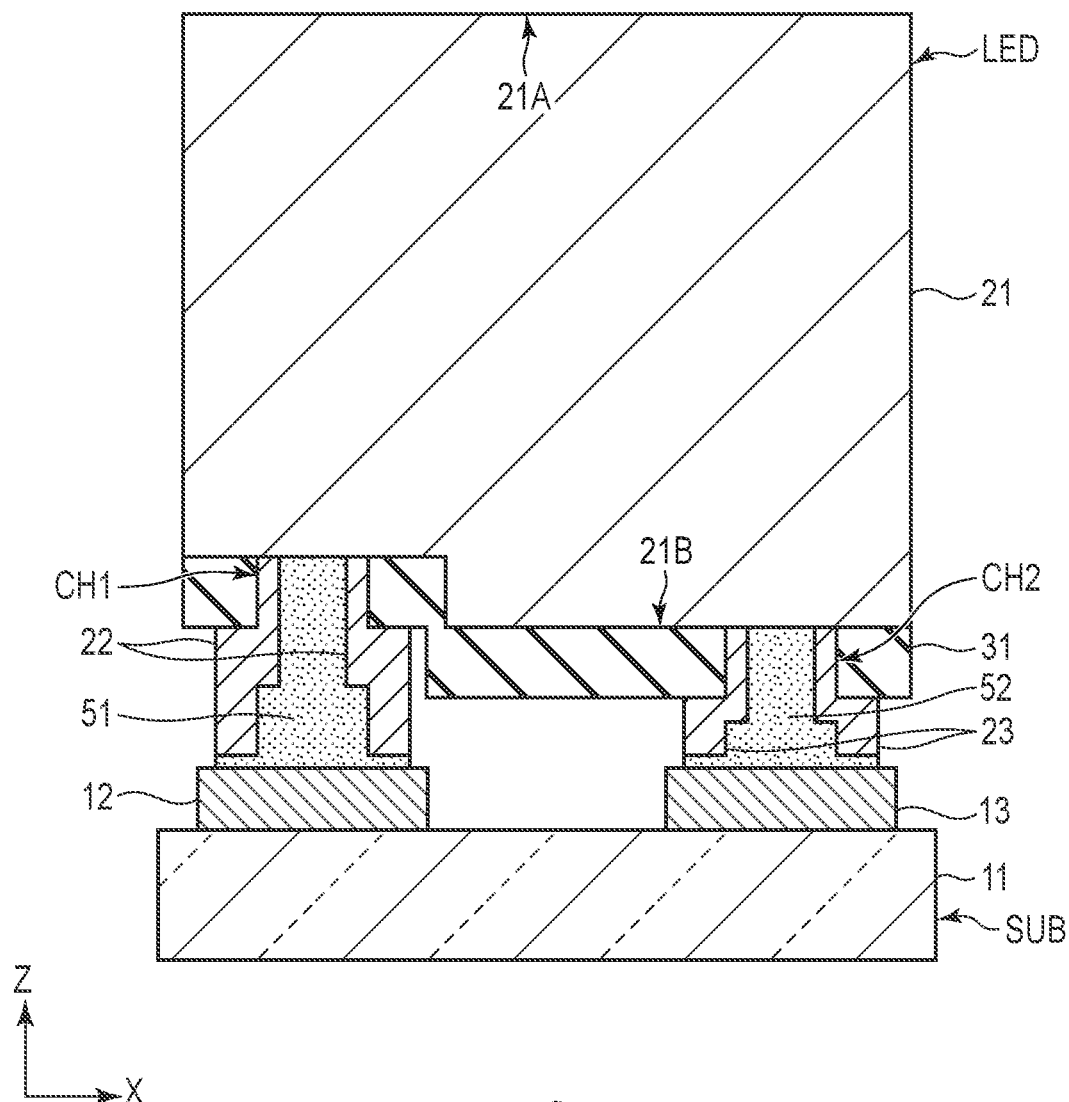
FIG. 4 is a cross-sectional view of an example in which the light-emitting element of the embodiment is mounted.

FIG. 4 illustrates an example in which the light-emitting element LED is mounted, more specifically, a configuration in which the first cavity portion 41 and the second cavity portion 42 are filled with the first alloy layer 51 and the second alloy layer 52, respectively, which are made of eutectic alloys.

In more detail, the following configuration is provided as an example, in which with the thermal energy of the laser beam LZ for bonding irradiated to the vicinity of the contact surface of the first connection electrode 12 and the first terminal electrode 22, the first connection electrode 12 and the first terminal electrode 22 are melted, and the molten metal ascends in the first cavity portion 41 by the so-called capillary action, and the first alloy layer 51 is formed to fill the first cavity portion 41. In other words, the first alloy layer 51 is formed (filled) inside the first cavity portion 41 so as to be in contact with the first connection electrode 12 and the second main surface 21B of the light-emitting portion 21.

Similarly, in the case of the second alloy layer 52, the following configuration is provided as an example, in which the second connection electrode 13 and the second terminal electrode 23 are melted by the thermal energy of the laser beam LZ for bonding irradiated in the vicinity of the contact surface between the second connection electrode 13 and the second terminal electrode 23, and the molten metal ascends in the second cavity portion 42 by the capillary action and is formed into the second alloy layer 52 to fill the second cavity portion 42. In other words, the second alloy layer 52 is formed (filled) inside the second cavity portion 42 so as to be in contact with the second connection electrode 13 and the second main surface 21B of the light-emitting portion 21.

Figure 5:
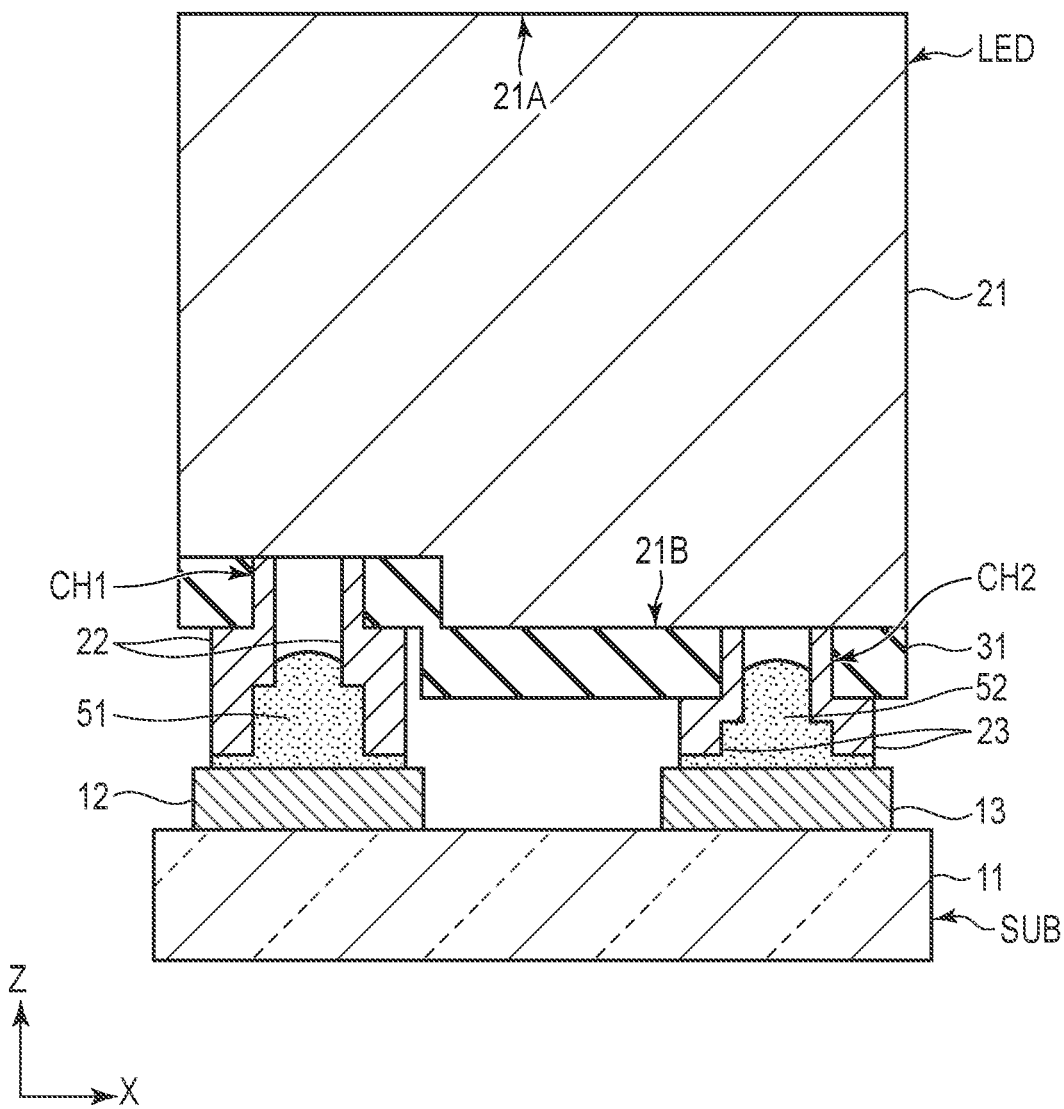
FIG. 5 is a cross-sectional view of another example in which the light-emitting element of the embodiment is mounted.

However, the example in which the light-emitting element LED is mounted is not limited to those provided above, but may be of such a configuration, for example, in which the first alloy layer 51 and the second alloy layer 52 are formed so as to partially fill the first cavity portion 41 and the second cavity portion 42, as shown in FIG. 5. In other words, the first alloy layer 51 is formed in the first cavity portion 41 so as to be in contact with the first connection electrode 12 but not in contact with the second main surface 21B of the light-emitting portion 21, and the second alloy layer 52 is formed in the second cavity portion 42 so as to be in contact with the second connection electrode 13 but not in contact with the second main surface 21B of the light-emitting portion 21. Even in this case, the configuration remains the same in that the first connection electrode 12 and the first terminal electrode 22 are metal-joined by the first alloy layer 51, and the second connection electrode 13 and the second terminal electrode 23 are metal-joined by the second alloy layer 52.

Figure 6:
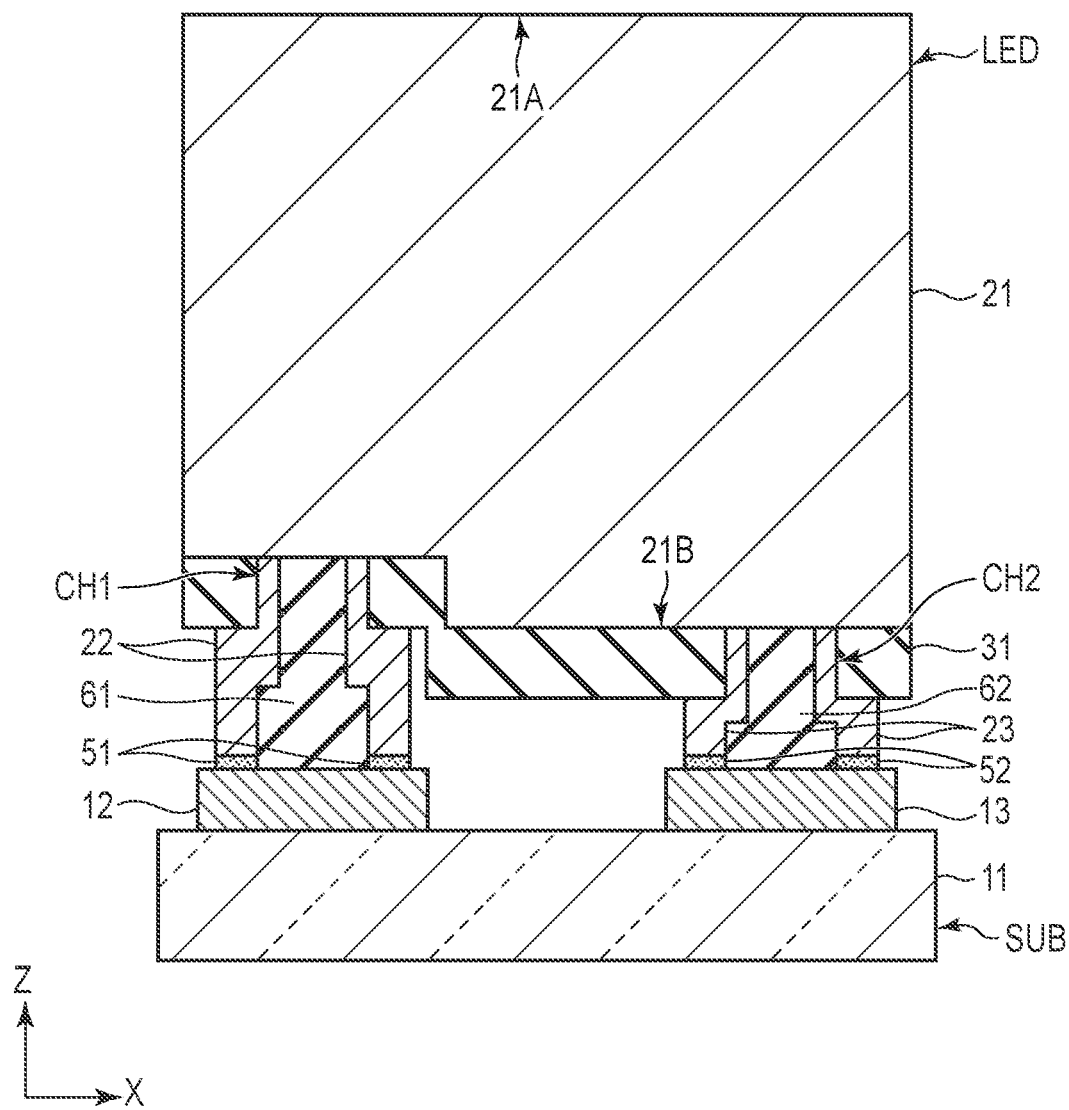
FIG. 6 is a cross-sectional view of still another example in which the light-emitting element of the embodiment is mounted.

Alternatively, as shown in FIG. 6, the light-emitting element LED may be mounted by placing a first transmissive member 61 made a material that transmits the laser beam LZ for bonding, in the first cavity portion 41 and a second transmissive member 62 made of a material that transmits the laser beam LZ for bonding, in the second cavity portion 42, followed by irradiating the laser beam LZ from the light-emitting portion 21 side. The first transmitting member 61 and the second transmitting member 62 are made of a material that transmits the laser beam LZ for bonding, such as silicon oxide (SiO2) or aluminum oxide (Al2O3). Even in this case, the configuration remains the same in that the first connection electrode 12 and the first terminal electrode 22 are metal-joined by the first alloy layer 51, and the second connection electrode 13 and the second terminal electrode 23 are metal-joined by the second alloy layer 52.

According to the configuration in which all of the first cavity portion 41 and the second cavity portion 42 are filled with the first alloy layer 51, the second alloy layer 52, the first transmissive member 61, the second transmissive member 62 and the like, as shown in FIGS. 4 and 6, an improvement in strength can be expected as compared to a configuration in which they are not.

Further, the first alloy layer 51 and the second alloy layer 52 formed inside the first cavity portion 41 and the second cavity portion 42, respectively, can be simply referred to as conductive connection members. As shown in FIGS. 4 and 5, the conductive connecting members formed inside the first cavity portion 41 and the second cavity portion 42 may all be the first alloy layer 51 and the second alloy layer 52. But, it suffices only if at least the contact surface between the first terminal electrode 22 which forms a side wall of the first cavity portion 41 and the respective conductive connection member and the contact surface between the second terminal electrode 23 which forms a side wall of the second cavity portion 42 and the respective conductive connection members are the first alloy layer 51 and the second alloy layer 52, respectively. When the first alloy layer 51 and the second alloy layer 52 are formed on the contact surfaces of the first terminal electrode 22 and the second terminal electrode 23, respectively, the first cavity portion 41 and the second cavity portion 42 inside the first alloy layer 51 and the second alloy layer 52, respectively, may be filled, for example, with a conductive material that forms the first connection electrode 12 and the second connection electrode 13, for example, Tin (Sn).

Here, effects of the light-emitting element LED of this embodiment will be described using a comparative example. Note that the comparative example is provided to illustrate some of the effects that the light-emitting element LED according to the present embodiment can exhibit, and do not exclude from the scope of the present invention the effects that are common between the comparative example and this embodiment.

Figure 7:
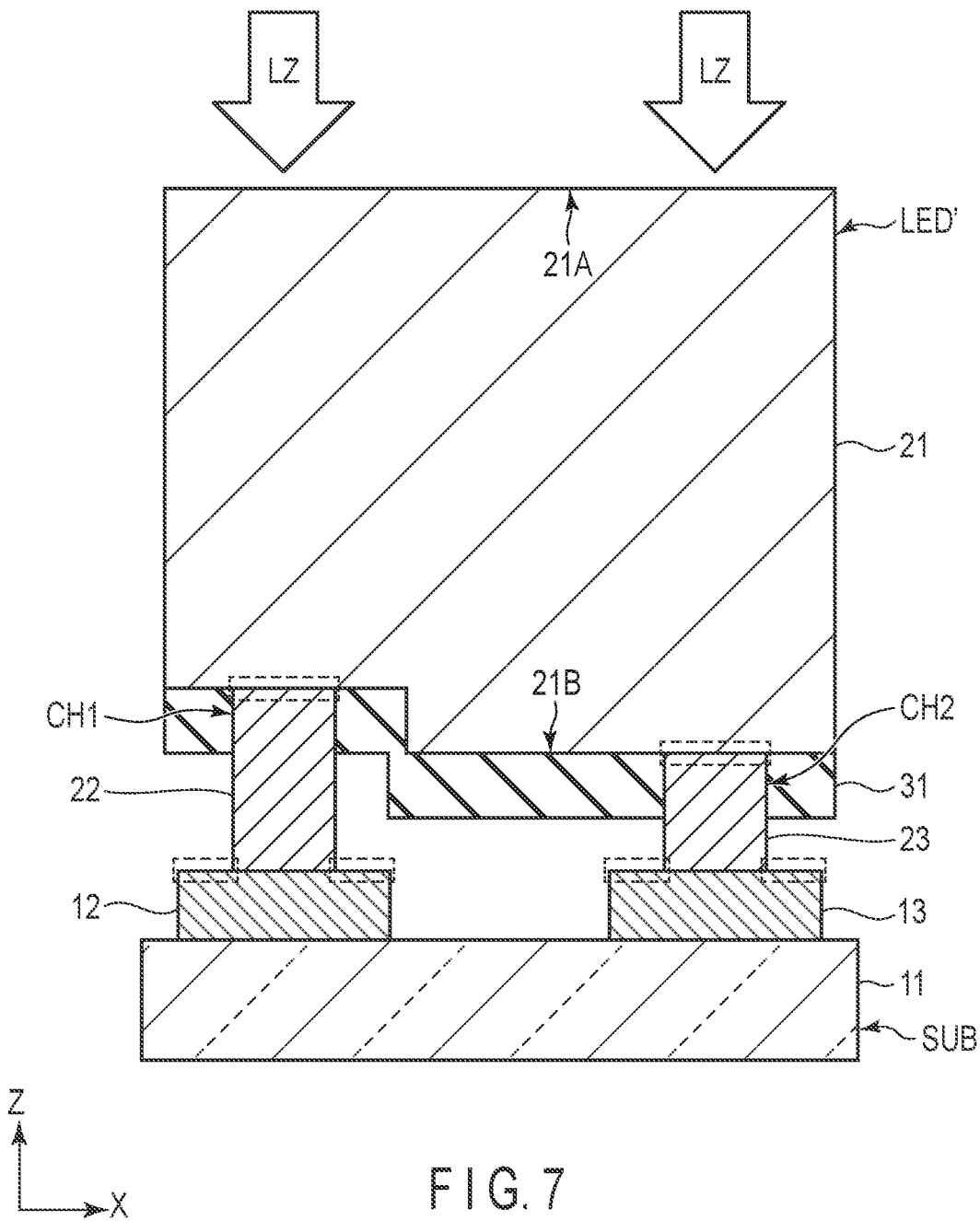
FIG. 7 is a cross-sectional view showing an example of the configuration of a light-emitting element of a comparative example.

The light-emitting element LED' of the comparative example is different in configuration from the light-emitting element LED of the present embodiment in that the first cavity portion 41 and the second cavity portion 42, which transmit the laser beam LZ for bonding are not provided, as shown in FIG. 7.

In the light-emitting element LED' of the comparative example, when the laser beam LZ for bonding is irradiated from the light-emitting portion 21 side, the laser beam LZ for bonding is irradiated to the area enclosed by the dashed line in FIG. 7. That is, most of the laser beam LZ for bonding is irradiated to locations remote from the upper surfaces and the like of the first terminal electrode 22 and the second terminal electrode 23, the contact surface of the first connection electrode 12 and the first terminal electrode 22 and the contact surface of the second connection electrode 13 and the second terminal electrode 23.

With this configuration, the heat energy generated by the laser beam LZ for bonding cannot be sufficiently applied to the contact surface of the first connection electrode 12 and the first terminal electrode 22 and the contact surface of the second connection electrode 13 and the second terminal electrode 23. As a result, the metal joining between the first connection electrode 12 and the first terminal electrode 22 and the metal joining between the second connection electrode 13 and the second terminal electrode 23 may not be sufficiently achieved. Or the heat energy generated by the laser beam LZ for bonding, cannot be sufficiently applied to the contact surface of the first connection electrode 12 and the first terminal electrode 22 and the contact surface of the second connection electrode 13 and the second terminal electrode 23. As a result, it may take some time to form the first alloy layer 51 between the first connection electrode 12 and the first terminal electrode 22 and the second alloy layer 52 between the second connection electrode 13 and the second terminal electrode 23.

On the other hand, the light-emitting element LED of this embodiment is provided with the first cavity portion 41 and the second cavity portion 42, and therefore, it is possible to irradiate the laser beam LZ for bonding to the vicinity of the contact surface of the first connection electrode 12 and the first terminal electrode 22, and to the vicinity of the contact surface of the second connection electrode 13 and the second terminal electrode 23, as shown in FIG. 3. With this configuration, the heat energy generated by the laser beam LZ for bonding can be more efficiently applied to each contact surface as compared to the case of the light-emitting element LED' in the comparative example.

Note that this embodiment illustrates as an example the case where the light emitting element LED is the so-called flip-chip type light-emitting element, in which the first terminal electrode 22 and the second terminal electrode 23 are aligned adjacent to each other, but the light emitting element LED may be of the so-called upper and lower electrode type, in which terminal electrodes are provided respectively on the first and second main surfaces 21A and 21B of the light-emitting portion 21. The upper terminal electrode on the first main surface 21A of the light-emitting portion 21 is formed from a transparent electrode such as of ITO so as to emit light from the light-emitting portion 21.

Even in this case, if the lower terminal electrode provided on the second main surface 21B side of the light-emitting portion 21 is provided with a cavity portion to transmit the laser beam LZ for bonding, the laser beam LZ for bonding irradiated from the light-emitting portion 21 side can be applied onto the vicinity of the contact surface between the lower terminal electrode and the connection electrode abutting to the lower terminal electrode. With this configuration, it is possible to efficiently apply the heat energy generated by the laser beam LZ for bonding to the contact surface.

This embodiment illustrates, as an example, the case where the first terminal electrode 22 and the second terminal electrode 23 are joined to the first connection electrode 12 and the second connection electrode 13 by eutectic joining. But it is also possible to join the first terminal electrode 22 and the second terminal electrode 23 with the first connection electrode 12 and the second connection electrode 13, respectively, by providing a connection conductive member such as solder provided between the first terminal electrode 22 and the first connection electrode 12, and between the second terminal electrode 23 and the second connection electrode 13, followed by melting the connecting conductive members with the laser beam LZ for joining. Even in this case, with the first cavity portion 41 and the second cavity portion 42 thus provided, it is possible to efficiently apply the thermal energy generated by the laser beam LZ for joining to each of the connecting conductive members.

Now, various modified examples of the embodiment will be described.

First Modified Example

Figure 8:
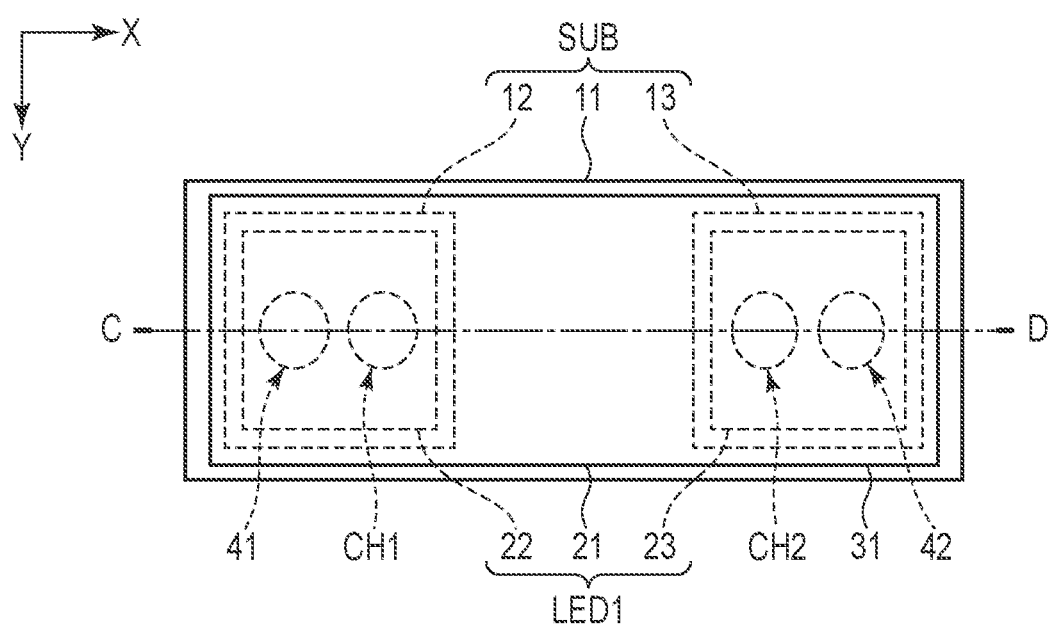
FIG. 8 is a cross-sectional view showing an example of the configuration of a light-emitting element of the first modified example.

First, the first modified example will be provided. FIG. 8 is a plan view showing an example of the configuration of the light-emitting element LED1 of the first modified example.

The light-emitting element LED1 of the first modified example is different in configuration from the light-emitting element LED of the embodiment in that the first opening CH1 for connecting the first terminal electrode 22 and the light-emitting portion 21 to each other and the first cavity portion 41 surrounded by the first terminal electrode 22 are arranged so that they do not overlap in planar view, as shown in FIG. 8. In other words, it differs from the configuration of the light-emitting element LED of the above embodiment in that the first cavity portion 41 is located outside the first opening CH1.

Further, the light-emitting element LED1 of the first modified example is also different in configuration from the light-emitting element LED of the embodiment in that the second opening CH2 for connecting the second terminal electrode 23 and the light-emitting portion 21 to each other and the second cavity portion 42 surrounded by the second terminal electrode 23 are arranged so that they do not overlap each other in planar view, as shown in FIG. 8. In other words, it differs in configuration from the light-emitting element LED of the embodiment in that the second cavity portion 42 is disposed outside the second opening CH2.

Figure 9:
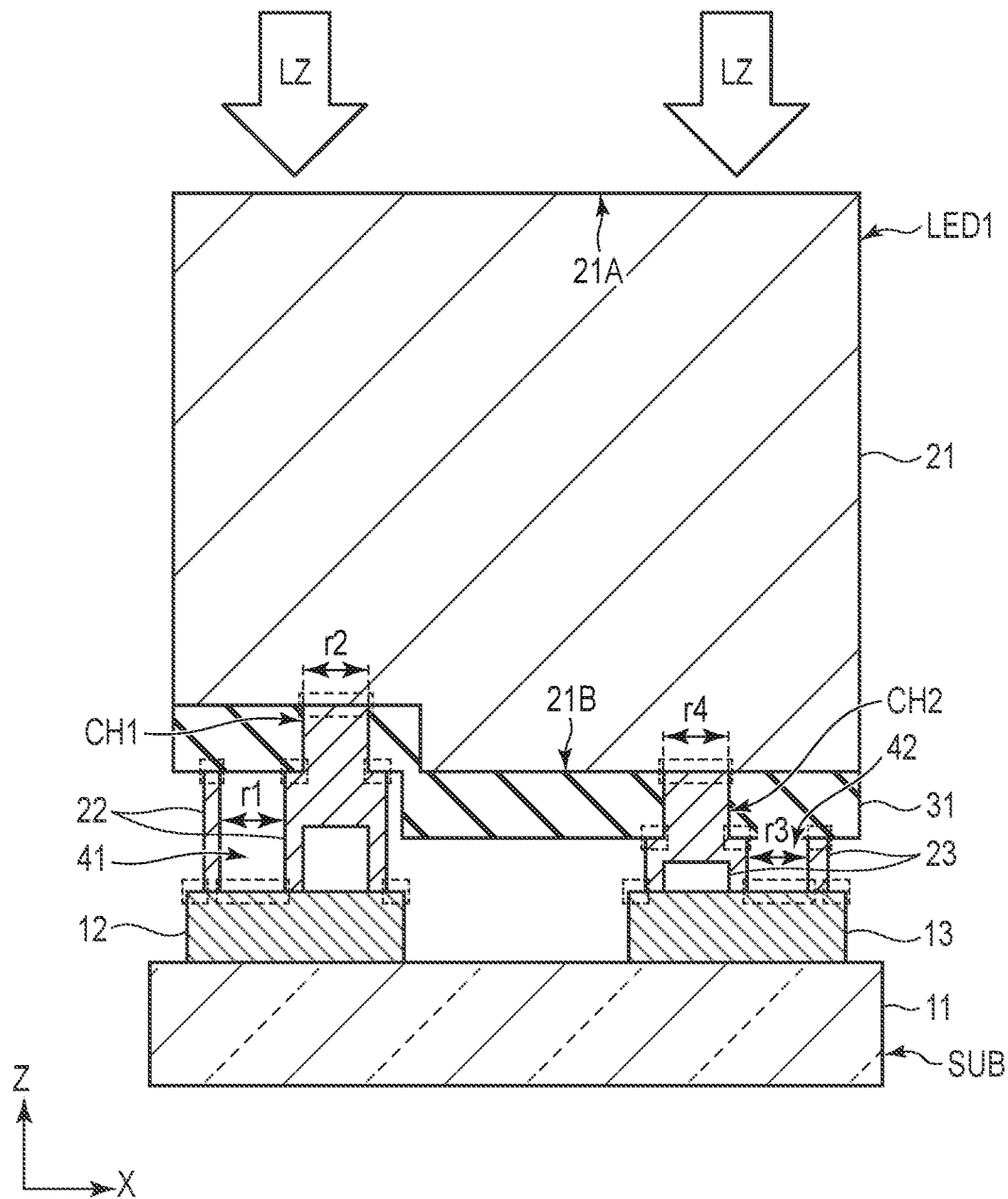
FIG. 9 is a cross-sectional view of the light-emitting element taken along line C-D shown in FIG. 8.

FIG. 9 is a cross-sectional view of the element taken along line C-D shown in FIG. 8.

As shown in FIG. 9, the first terminal electrode 22 is formed to be connected with the entire area of the second main surface 21B of the light-emitting portion 21, exposed by the first opening CH1 formed in the insulating layer 31. Further, as shown in FIG. 9, the first cavity portion 41 is provided at a position not overlapping in planar view the first opening CH1 formed in the insulating layer 31. In this configuration as well, the diameter r1 of the first cavity portion 41 should preferably be less than the diameter r2 of the first opening CH1, and it should preferably, for example, about 2 μm to 3 μm or less in size. Note that FIG. 9 illustrates, as an example, that configuration in which the first cavity portion 41 is provided on the left side of the figure and the first opening CH1 is formed on the right side of the figure, but the positions of the first cavity portion 41 and the first opening CH1 may be interchanged. In other words, the first cavity portion 41 may be provided on the right side of the figure and the first opening CH1 may be formed on the left side of the figure.

Similarly, the second terminal electrode 23 is formed to be connected with the entire area of the second main surface 21B of the light-emitting portion 21, exposed by the second opening CH2 formed in the insulating layer 31. As shown in FIG. 9, the second cavity portion 42 is provided at a position that does not overlap in planar view the second opening CH2 formed in the insulating layer 31. Even in this configuration, the diameter r3 of the second cavity portion 42 should preferably be less than the diameter r4 of the second opening CH2, which should preferably, be, for example, about 2 μm to 3 μm or less in size. Note that FIG. 9 illustrates, as an example, the configuration in which the second cavity portion 42 is provided on the right side of the figure and the second opening CH2 is formed on the left side of the figure is illustrated, but the positions of the second cavity portion 42 and the second opening CH2 may be interchanged. That is, the second cavity portion 42 may be provided on the left side of the figure and the second opening CH2 may be formed on the right side of the figure.

When the laser beam for bonding LZ is irradiated from the light-emitting portion 21 side to mount the light-emitting element LED1 of the first modified example described above to the array substrate SUB, the laser beam for bonding LZ is irradiated to the area enclosed by the dashed line shown in FIG. 9. That is, even with the configuration of the first modified example, the laser beam LZ for bonding can be irradiated to the vicinity of the contact surface between the first connection electrode 12 and the first terminal electrode 22 and to the vicinity of the contact surface between the second connection electrode 13 and the second terminal electrode 23, as compared to the configuration of the comparative example shown in FIG. 7. As a result, the thermal energy generated by the laser beam LZ for bonding can be more efficiently applied to each of the contact surfaces as compared to the case of the comparative example.

In the configuration of the first modified example, the first cavity portion 41 and the second cavity portion 42 may be filled with the first alloy layer 51 and the second alloy layer 52, as in the case of the configuration shown in FIG. 4. Or, as in the case of the configuration shown in FIG. 5, these portions may be partially filled with the first alloy layer 51 and the second alloy layer 52. Alternatively, in the first cavity portion 41 and the second cavity portion 42, a first transmission member 61 and a second transmission member 62 may be disposed respectively as in the configuration shown in FIG. 6.

Second Modified Example

Figure 10:
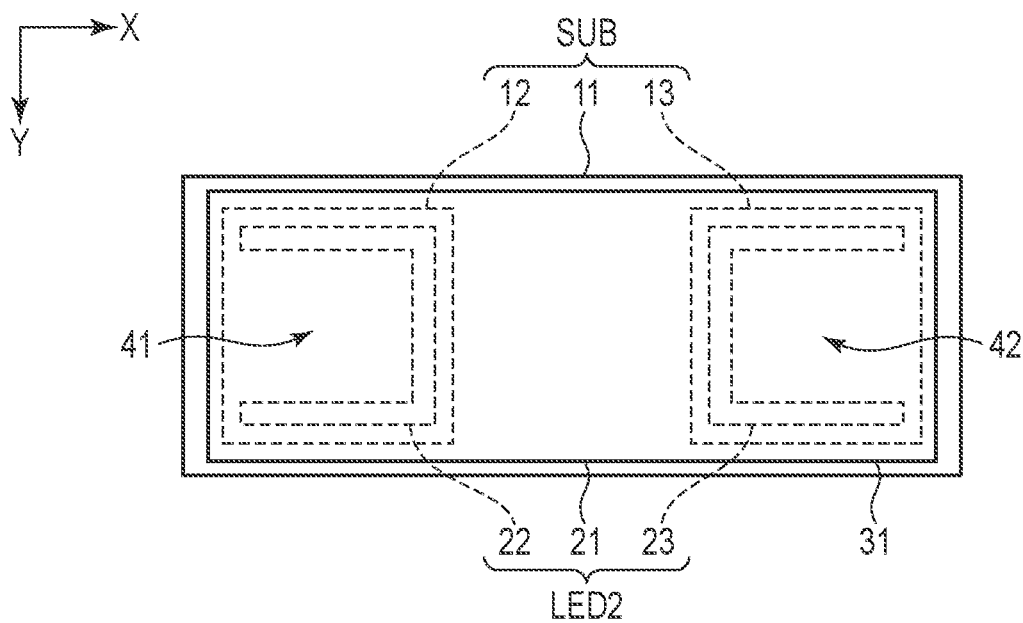
FIG. 10 is a plan view showing an example of the configuration of a light-emitting element of the second modified example.

Next, the second modified example will be described. FIG. 10 is a plan view showing an example of the configuration of the light-emitting element LED2 of the second modified example.

As shown in FIG. 10, the light-emitting element LED2 of the second modified example is different from the light-emitting element LED of the embodiment in that the second terminal electrode 23 has a U-shape in planar view and the first terminal electrode 22 has a shape in which the second terminal electrode 23 is inversed in planar view (hereinafter referred to as an inverted U-shape).

Both the first terminal electrode 22 with the inverted U-shape and the second terminal electrode 23 with the U-shape are connected to the light-emitting portion 21 through respective openings (not shown) formed in the insulating layer 31. The opening formed to connect the inverted U-shaped first terminal electrode 22 to the light-emitting portion 21 may be formed at any position as long as it overlaps the first terminal electrode 22 in planar view, and the shape and number may also be arbitrary. Similarly, the opening formed to connect the U-shaped second terminal electrode 23 to the light-emitting portion 21 may also be formed at any position as long as it overlaps the second terminal electrode 23 in planar view, and the shape and number may also be arbitrary.

In the light emitting element LED2 of the second modified example, the opening (recess portion) of the inverted U-shaped first terminal electrode 22 corresponds to the first cavity portion 41, and the opening (recess portion) of the U-shaped second terminal electrode 23 corresponds to the second cavity portion 42.

When the laser beam for bonding LZ is irradiated from the light-emitting portion 21 side to mount the light-emitting element LED2 of the second modified example described above to the array substrate SUB, the laser beam for bonding LZ passes through the light-emitting portion 21, the first cavity portion 41 and the second cavity portion 42, and most of the laser beam is applied to the vicinity of the contact surface of the first connection electrode 12 and the first terminal electrode 22, and the vicinity of the contact surface of the second connection electrode 13 and the second terminal electrode 23. That is, even in the configuration of the second modified example, the laser beam for bonding LZ can be irradiated to the vicinity of the contact surface of the first connection electrode 12 and the first terminal electrode 22, and to the vicinity of the contact surface of the second connection electrode 13 and the second terminal electrode 23, as compared to the configuration of the comparative example shown in FIG. 7. As a result, it is possible to irradiate the laser beam LZ for bonding to more efficiently apply the heat energy generated by the laser beam LZ to each of the contact surfaces.

In the light-emitting element LED2 of the second modified example, a part of the first terminal electrode 22, which is a side extending along the second direction Y and a part of the second terminal electrode 23, which is a side extending along the second direction Y can be made to function as a wall to prevent the metal melted by the thermal energy of the laser beam for bonding LZ from flowing into the other electrode side with respect from each other. With this configuration, it is possible to prevent the first terminal electrode 22 and the second terminal electrode 23 from being connected to each other and short-circuited.

Third Modified Example

Figure 11:
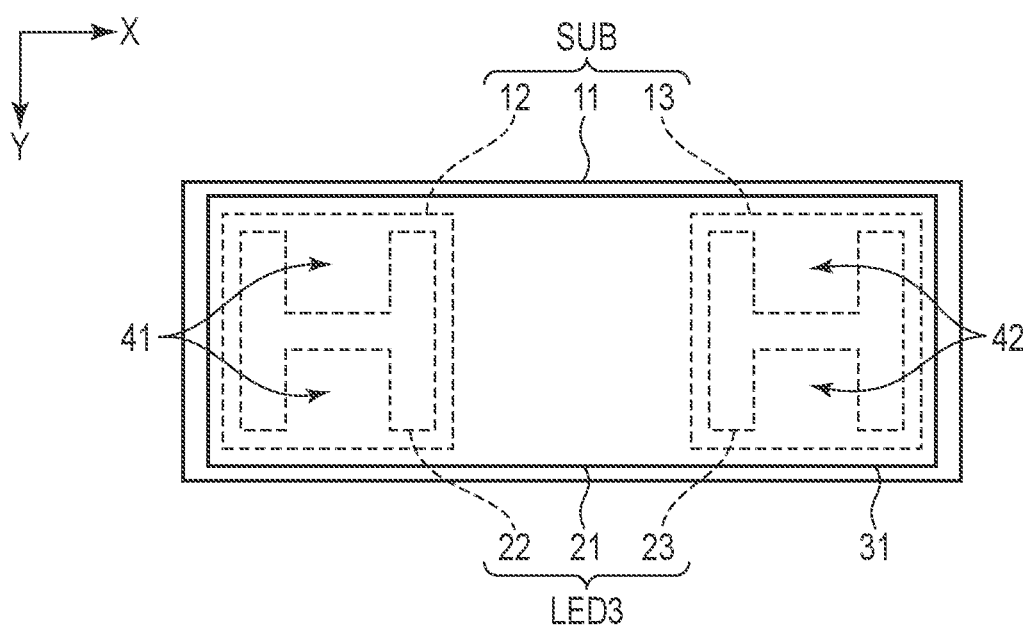
FIG. 11 is a plan view showing an example of the configuration of a light-emitting element of the third modified example.

The third modified example will now be described. FIG. 11 is a diagram showing an example of the configuration of the light-emitting element LED3 of the third modified example.

As shown in FIG. 11, the light-emitting element LED3 of the third modified example is different in configuration from the light-emitting element LED of to the embodiment provided above in that the first terminal electrode 22 and the second terminal electrode 23 both have an H-shape in planar view.

The first terminal electrode 22 and the second terminal electrode 23, both having an H-shape, are connected to the light-emitting portion 21 via openings (not shown) formed in the insulating layer 31. Since the positions, shape, and number of the openings can be arbitrary as in the case of the second modified example described above, a detailed description thereof is omitted here.

In the light emitting element LED3 of the third modified example, two openings (recess portions) of the H-shaped first terminal electrode 22 both correspond to the first cavity portion 41, and two openings (recess portions) of the H-shaped second terminal electrode 23 both correspond to the second cavity portion 42.

When the laser beam LZ for bonding is irradiated from the light-emitting portion 21 side to mount the light-emitting element LED3 of the third modified example described above to the array substrate SUB, most of the laser beam is irradiated to the vicinity of the contact surface of the first connection electrode 12 and the first terminal electrode 22, and to the vicinity of the contact surface of the second connection electrode 13 and the second terminal electrode 23 as in the case of the second modified example described above. That is, with the configuration of the third modified example, effects similar to those already described can be obtained.

Note that, as in the case of the second modified example described above, in the light-emitting element LED3 of the third modified example, a part of the first terminal electrode 22, which is a side extending along the second direction Y and a part of the second terminal electrode 23, which is a side extending along the second direction Y each can be made to function as a wall to prevent the metal melted by the thermal energy of the laser beam for bonding LZ from flowing into the other electrode side with respect from each other. With this configuration, it is possible to prevent the first terminal electrode 22 and the second terminal electrode 23 from being connected to each other and short-circuited.

Fourth Modified Example

Figure 12:
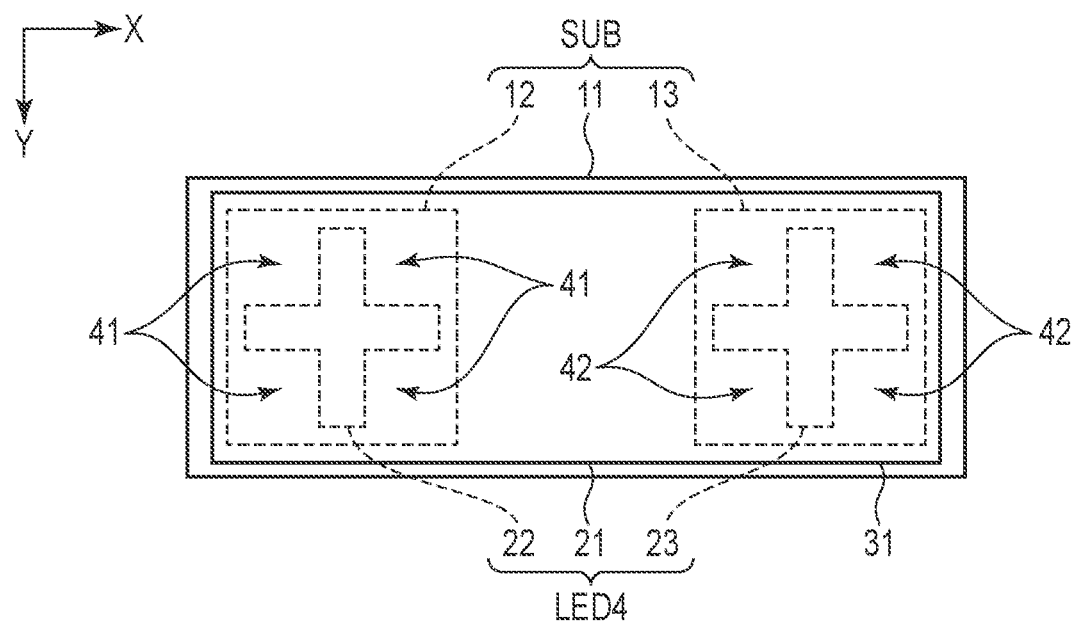
FIG. 12 is a plan view showing an example of the configuration of a light-emitting element of the fourth modified example.

Next, the fourth modified example will now be described. FIG. 12 is a plan view showing an example of the configuration of the light-emitting element LED4 in the fourth modified example.

The light-emitting element LED4 of the fourth modified example is different in configuration from the light-emitting element LED of the embodiment described above in that both the first terminal electrode 22 and the second terminal electrode 23 have a cross shape in planar view, as shown in FIG. 12.

Both the cross-shaped first terminal electrode 22 and second terminal electrode 23 are connected to the light-emitting portion 21 through openings (not shown) formed in the insulating layer 31. Note that the position, shape, and number of the openings can be arbitrary as in the cases of the second and third modified examples described above, and therefore a detailed description thereof is omitted here.

In the light emitting element LED4 of the fourth modified example, any of the four openings (recess portions) of the cross-shaped first terminal electrode 22 correspond to the first cavity portion 41, and any of the four openings (recess portions) of the cross-shaped second terminal electrode 23 correspond to the second cavity portion 42.

When the laser beam LZ for bonding is irradiated from the light-emitting portion 21 side to mount the light-emitting element LED4 of the fourth modified example described above to the array substrate SUB, most of the beam is irradiated to the vicinity of the contact surface of the first connection electrode 12 and the first terminal electrode 22, and to the vicinity of the contact surface of the second connection electrode 13 and the second terminal electrode 23, as in the case of the second and third modified examples described above. That is, with the configuration of the fourth modified example, effects similar to those already described can be obtained.

Fifth Modified Example

Figure 13:
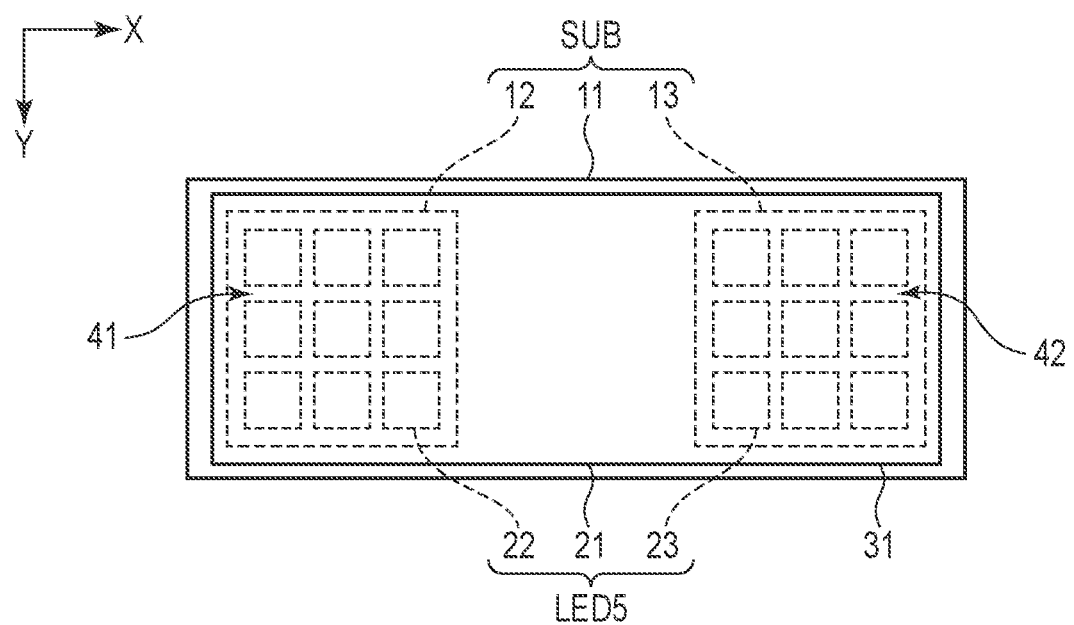
FIG. 13 is a plan view showing an example of the configuration of a light-emitting element of the fifth modified example.

The fifth modified example will now be described. FIG. 13 is a plan view showing an example of the configuration of the light-emitting element LED5 in the fifth modified example.

As shown in FIG. 13, the light-emitting element LED5 of the fifth modified example is different in configuration from the light-emitting element LED of to the embodiment above in that both the first terminal electrode 22 and the second terminal electrode 23 have a shape in which a plurality of electrodes are arranged in a matrix in planar view.

The first terminal electrodes 22 and the second terminal electrodes 23, which are made from a plurality of electrodes arranged in a matrix shape, are connected to the light-emitting portion 21 through respective openings (not shown) formed in the insulating layer 31. The openings formed to connect the first terminal electrodes 22 to the light-emitting portion 21 are each formed, for example, for some of the electrodes used as the first terminal electrodes 22. Further, the openings formed to connect the second terminal electrodes 23 to the light-emitting portion 21 are each formed, for example, for some of the electrodes used as the second terminal electrode 23.

In the light-emitting element LED 5 according to the fifth modified example, of those electrodes which constitute the first terminal electrodes 22, a set of a number of gaps locating between adjacent pairs of electrodes correspond to the first cavity portion 41, and of those electrodes which constitute the second terminal electrode 23, a set of a number of gaps locating between adjacent pairs of electrodes correspond to the second cavity portion 42.

When the laser beam for bonding LZ is irradiated from the light-emitting portion 21 side to mount the light-emitting element LED5 of the fifth modified example described above to the array substrate SUB, as in the cases of the second to fourth modified examples described above, most of the laser beam is irradiated to the vicinity of each contact surface of the first connection electrode 12 and each respective first terminal electrode 22, and to the vicinity of each contact surface of the second connection electrode 13 and each respective second terminal electrode 23. That is, with the configuration of the fifth modified example, effects similar to those already described can be obtained.

Sixth Modified Example

Figure 14:
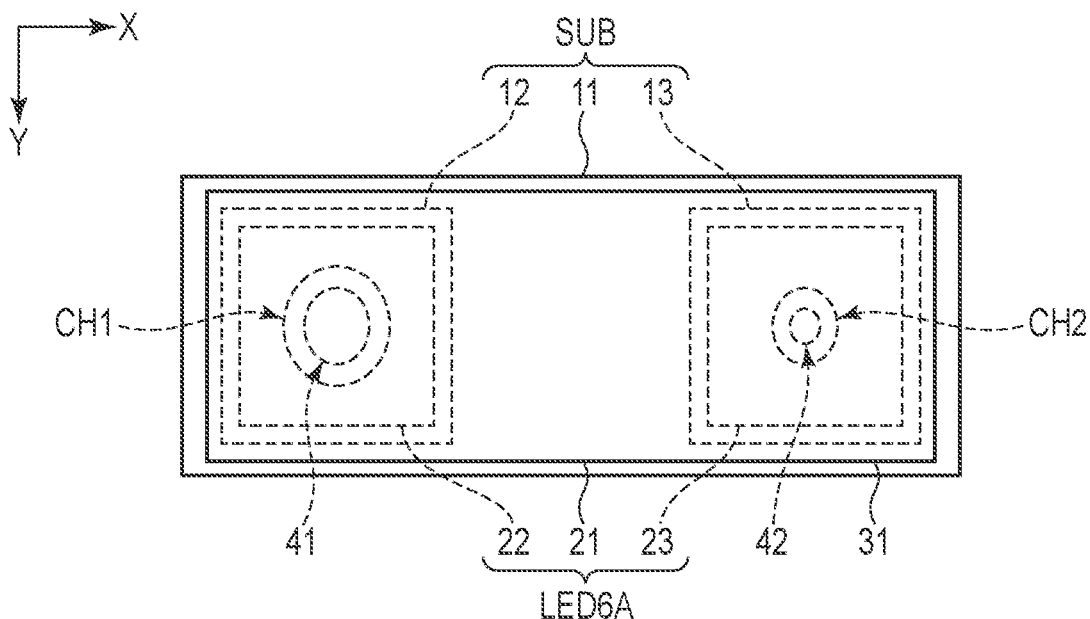
FIG. 14 is a plan view showing an example of the configuration of a light-emitting element of the sixth modified example.

Next, the sixth modified example will be described. FIG. 14 is a plan view showing an example of the configuration of the light-emitting element LED6A in the sixth modified example, and FIG. 15 is a plan view showing an example of the configuration of the light-emitting element LED6B in the sixth modified example.

Figure 15:
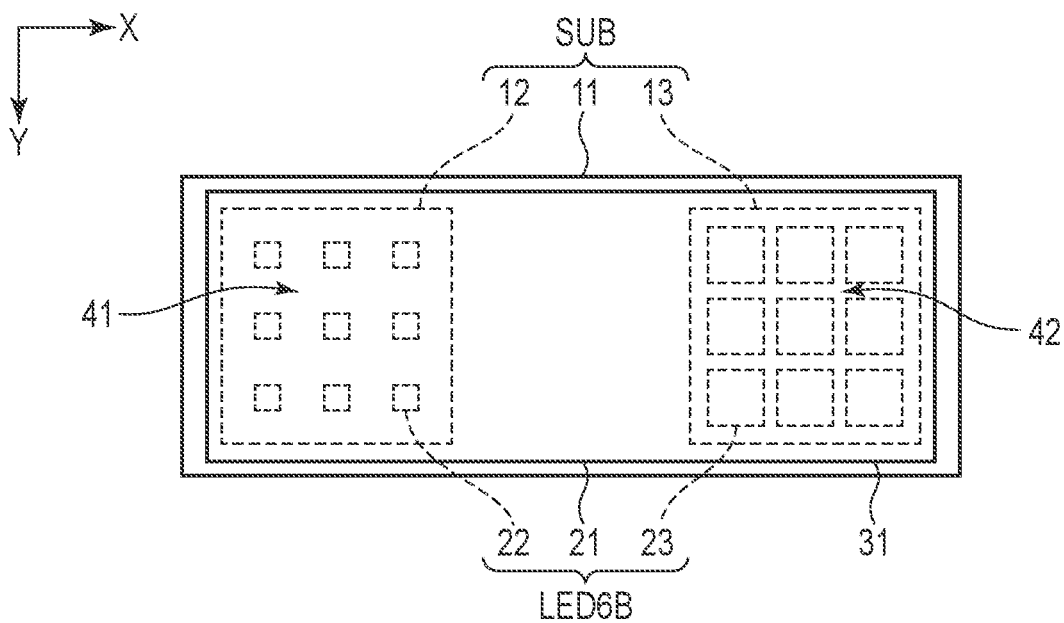
FIG. 15 is a plan view showing another example of the configuration of the light-emitting element of the sixth modified example.

The light-emitting element LED 6A and the light-emitting element LED 6B of the sixth modified example are different in configuration from the light-emitting element LED of the embodiment described above in that the first cavity portion 41 and the second cavity portion 42 have different areas in planar view, as shown in FIGS. 14 and 15.

As already explained, the length of the first terminal electrode 22 along the third direction Z and the length of the second terminal electrode 23 along the third direction Z are different from each other due to the step made in the second main surface 21B of the light-emitting portion 21. With this configuration, when the laser beam LZ for bonding is irradiated to the first terminal electrode 22 and the second terminal electrode 23 with the same output, a difference may be created in the way in which the thermal energy generated by the laser beam LZ for bonding is applied to the first terminal electrode 22 and to the second terminal electrode 23. More specifically, in the first terminal electrode 22 side, where the length along the third direction Z is greater, it may require more time for the thermal energy to spread over, whereas in the second terminal electrode 23 side, where the length along the third direction Z is less, it may require less time for the thermal energy to spread.

However, in the light emitting element LED6A shown in FIG. 14, the area (size) of the first cavity portion 41 provided in the first terminal electrode 22, which has a greater length along the third direction Z, is larger than the area (size) of the second cavity portion 42 provided in the second terminal electrode 23, which has a les length along the third direction Z.

With this configuration, when the laser beam LZ for bonding is irradiated from the light-emitting portion 21 side, the first terminal electrode 22 can transmit more laser beam LZ than the second terminal electrode 23. Therefore, the time required for the thermal energy to spread over to the first terminal electrode 22 side can be shortened, and as a result, it is possible to approximately equalize the time required for the thermal energy to spread over, between the first terminal electrode 22 and the second terminal electrode 23.

Similarly, in the light-emitting element LED6B shown in FIG. 15, the area per electrode of those electrodes which constitute the first terminal electrodes 22 is reduced as compared to the area per electrode of those electrodes which constitute the second terminal electrodes 23, or the number of electrodes which constitute the first terminal electrodes 22 is decreased as compared to the number of electrodes which constitute the second terminal electrodes 23. Thus, the area (size) of the first cavity portion 41 provided in the first terminal electrodes 23 with a greater length along the third direction Z is larger than the area (size) of the second cavity portion 42 provided in the second terminal electrodes 23 with a less length along the third direction Z.

With this configuration, when the laser beam LZ for bonding is irradiated from the light-emitting portion 21 side, the first terminal electrode 22 can transmit more laser beam LZ than the second terminal electrode 23. Thus, the time required for the thermal energy to spread over to the first terminal electrode 22 side can be shortened, and as a result, it is possible to approximately equalize the time required for the thermal energy to spread over, between the first terminal electrode 22 and the second terminal electrode 23.

According to at least one of the embodiments described above, it is possible to provide a light-emitting element LED that can be efficiently mounted on an array substrate SUB of an electronic device (display device 1) and an electronic device (display device 1) in which the light-emitting element LED is mounted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting element to be mounted on a substrate on which a pair of a first connection electrode and a second connection electrode are formed, the light-emitting element comprising:
    a light-emitting portion including a first main surface that emits light and a second main surface on an opposite side to the first main surface; and
    a first terminal electrode and a second terminal electrode, provided on a second main surface side of the light-emitting portion,
    the first terminal electrode including a first cavity portion at a position overlapping the first connection electrode in planar view when the first terminal electrode is brought into contact with the first connection electrode, and joined with the first connection electrode by a laser beam irradiated from the light-emitting portion side, and
    the second terminal electrode including a second cavity portion at a position overlapping the second connection electrode in planar view when the second terminal electrode is brought into contact with the second connection electrode, and joined with the second connection electrode by the laser beam.

2. The light-emitting element of claim 1, wherein
    a height of the first terminal electrode is greater than that of the second terminal electrode, and
    a height of the first cavity portion is greater than that of the second cavity portion.

3. The light-emitting element of claim 1, further comprising:

an insulating layer provided to cover the second main surface of the light-emitting portion, wherein the first terminal electrode is connected to the light-emitting portion via a first opening formed in the insulating layer, the second terminal electrode is connected to the light-emitting portion via a second opening formed in the insulating layer, the first cavity portion is provided at a position overlapping the first opening in planar view, and the second cavity portion is provided at a position overlapping the second opening in planar view.

4. The light-emitting element of claim 3, wherein the first terminal electrode is connected to a portion of the second main surface of the light emitting portion, exposed by the first opening, and the second terminal electrode is connected to a portion of the second main surface of the light-emitting portion, exposed by the second opening.

5. The light-emitting element of claim 4, wherein the first cavity portion is surrounded by the first terminal electrode, and the second cavity is surrounded by the second terminal electrode.

6. The light-emitting element of claim 1, further comprising:

an insulating layer provided to cover the second main surface of the light-emitting portion, wherein the first terminal electrode is connected to the light-emitting portion via a first opening formed in the insulating layer, the second terminal electrode is connected to the light-emitting portion via a second opening formed in the insulating layer, the first cavity portion is provided at a position not overlapping the first opening in planar view, and the second cavity is provided at a position not overlapping the second opening in planar view.

7. The light-emitting element of claim 6, wherein the second terminal electrode has a U-shape in planar view, and the first terminal electrode has a shape in which the U-shape is reversed in planar view.

8. The light-emitting element of claim 6, wherein the first terminal electrode and the second terminal electrode both have an H-shape in planar view.

9. The light-emitting element of claim 6, wherein the first terminal electrode and the second terminal electrode both have a cross shape in planar view.

10. The light-emitting element of claim 6, wherein the first terminal electrode and the second terminal electrode both have a shape in which a plurality of electrodes are arranged in a matrix in planar view.

11. The light-emitting element of claim 1, wherein the first cavity portion and the second cavity portion have the same area in planar view.

12. The light-emitting element of claim 1, wherein the first cavity and the second cavity have areas different from each other in planar view.

13. The light-emitting element of claim 1, wherein the laser beam is transmitted through the light-emitting portion and the first cavity portion, and irradiated to a vicinity of a contact surface of the first terminal electrode and the first connection electrode, and the laser beam is transmitted through the light-emitting portion and the second cavity, and irradiated in a vicinity of a contact surface of the second terminal electrode and the second connection electrode.

14. An electronic device comprising:

a substrate on which a pair of a first connection electrode and a second connection electrode are formed; and a light-emitting element mounted on the substrate and electrically connected to the first connection electrode and the second connection electrode, the light-emitting element comprising:

a light-emitting portion including a first main surface that emits light and a second main surface on an opposite side to the first main surface, and a first terminal electrode and a second terminal electrode provided on a second main surface side of the light-emitting portion, and the first terminal electrode including a first cavity portion at a position where overlapping the first connection electrode in planar view when the first terminal electrode is brought into contact with the first connection electrode, and joined to the first connection electrode by a laser beam irradiated from the light-emitting portion side, and the second terminal electrode including a second cavity portion at a position overlapping the second connection electrode in planar view when the second terminal electrode is brought into contact with the second connection electrode, and joined to the second connection electrode by the laser beam.

15. The electronic device of claim 14, wherein the light-emitting element further comprises an insulating layer provided to cover the second main surface of the light-emitting portion, the first terminal electrode is connected to the light emitting portion via a first opening formed in the insulating layer, the second terminal electrode is connected to the light-emitting portion via a second opening formed in the insulating layer, the first cavity is provided at a position overlapping the first opening in planar view, and the second cavity is provided at a position overlapping the second opening in planar view.

16. The electronic device of claim 14, further comprising:

a first conductive connection member interposed between the first connection electrode and the light emitting portion, inside the first cavity portion; and a second conductive connection member interposed between the second connection electrode and the light-emitting portion inside the second cavity portion.

17. The electronic device of claim 16, wherein the first conductive connection member is filled inside the first cavity portion, the first conductive connection member is in contact with the first connection electrode and the second main surface of the light-emitting portion, inside the first cavity, the second conductive connection member is filled inside the second cavity portion, and the second conductive connection member is in contact with the second connection electrode and the second main surface of the light-emitting portion, inside the second cavity.

18. The electronic device of claim 16, wherein the first conductive connection member is in contact with the first connection electrode without being in contact with the second main surface of the light-emitting portion, inside the first cavity, and the second conductive connection member is in contact with the second connection electrode without being in contact with the second main surface of the light-emitting portion, inside the second cavity.

* * * * *